United States Patent [19]

Iwasaki et al.

[11] Patent Number: 4,629,680

[45] Date of Patent: Dec. 16, 1986

[54] PHOTOPOLYMERIZABLE MATERIALS CAPABLE OF BEING DEVELOPED BY A WEAK ALKALINE AQUEOUS SOLUTION

[75] Inventors: Masayuki Iwasaki; Minoru Maeda; Fumiaki Shinozaki, all of Shizuoka; Kazuo Maemoto, Kanagawa, all of Japan

[73] Assignee: Fuji Photo Film Co., Ltd., Kanagawa, Japan

[21] Appl. No.: 695,503

[22] Filed: Jan. 28, 1985

[30] Foreign Application Priority Data

Jan. 30, 1984 [JP] Japan .................................. 59-14820
Jun. 5, 1984 [JP] Japan ................................. 59-114736

[51] Int. Cl.$^4$ ........................... G03C 1/68; C08F 8/00
[52] U.S. Cl. ..................................... 430/288; 430/281; 430/284; 430/910; 522/121; 522/95
[58] Field of Search ............... 430/910, 288, 284, 281; 204/159.16; 522/121, 95

[56] References Cited

U.S. PATENT DOCUMENTS

| | | | |
|---|---|---|---|
| 3,804,631 | 4/1974 | Faust | 430/910 X |
| 3,930,865 | 1/1976 | Faust et al. | 430/910 X |
| 4,012,559 | 3/1977 | Fujioka et al. | 204/159.16 |
| 4,139,391 | 2/1979 | Ikeda et al. | 430/288 |
| 4,427,760 | 1/1984 | Nagazawa et al. | 430/910 X |

*Primary Examiner*—John E. Kittle
*Assistant Examiner*—Cynthia Hamilton
*Attorney, Agent, or Firm*—Sughrue, Mion, Zinn, Macpeak, and Seas

[57] ABSTRACT

A photopolymerizable composition is described, comprising an addition polymerizable unsaturated compound having at least two ethylenically unsaturated double bonds in the molecule, a photopolymerzation initiator, and a binder, said binder being a copolymer composed of at least one recurring unit of group (A), at least one recurring unit of group (B), and at least can recurring unit of group (C), and having a weight average molecular weight of 5,000 to 5,000,000, wherein (A) is a methacrylate or benzyl methacrylate unit having a glass transition point of the homopolymer of higher than 50° C. and having an alkyl group having from 3 to 10 carbon atoms, (B) is an acrylate unit having a glass transition point of the homopolymer of lower than 110° C. and having an alkyl group having from 1 to 6 carbon atoms, and (C) is an α,β-ethylenically unsaturated carboxylic acid unit, and wherein the content of the component of group (A) is from 5 to 70 mol %, the content of the component of group (B) is from 5 to 70 mol %, and the content of the component of group (C) is from 20 to 60 mol %, provided that the total content of the components of groups (A), (B) and (C) is 100 mol %.

13 Claims, No Drawings

PHOTOPOLYMERIZABLE MATERIALS CAPABLE OF BEING DEVELOPED BY A WEAK ALKALINE AQUEOUS SOLUTION

FIELD OF THE INVENTION

This invention relates to a novel photopolymerizable composition, and more particularly to an improved photopolymerizagle composition capable of being developed by a weak alkaline aqueous solution containing no organic solvent.

BACKGROUND OF THE INVENTION

Hitherto, an organic solvent has been used as a developer for photopolymerizable compositions but organic solvents generally are expensive, have toxic properties, and are combustible. Furthermore, due to the use of such an organic solvent, large costs are incurred for labor health and environmental pollution planning. Accordingly, a photopolymerizable composition which can be developed without using such an organic solvent has long been desired. In general, the component for determining the solubility and other properties of a photopolymerizable composition is a binder composition of the photopolymerizable composition.

Thus, photopolymerizable compositions capable of being developed by an alkaline aqueous solution are proposed, for example, in Japanese Patent Publication No. 14065/60 (wherein the binder is a polymer containing an oxyacid at the side chain), Japanese Patent Publication No. 32714/71 (corresponding to British Pat. No. 1,148,362) (wherein the binder is, for example, a methyl methacrylate/methacrylic acid copolymer), Japanese Patent Publication No. 34327/79 (corresponding to U.S. Pat. No. 3,804,631) (wherein the binder is, for example, a methyl methacrylate/2-ethylhexyl methacrylate/methacrylic acid terpolymer), Japanese Patent Publication No. 38961/80 (corresponding to U.S. (B1) Pat. No. 3,887,450) (wherein the binder is, for example, a styrene/maleic acid mono-n-butyl ester copolymer), Japanese Patent Publication No. 33413/81 (corresponding to U.S. Pat. No. 3,833,384) (wherein the binder is, for example, an ethyl methacrylate/ethyl acrylate/methacrylic acid terpolymer), Japanese Patent Publication No. 25957/79 (wherein the binder is, for example, a styrene/methyl methacrylate/ethyl acrylate/methacrylic acid quaternay copolymer), Japanese Patent Application (OPI) No. 99810/77 (wherein the binder is, for example, a benzyl methacrylate/methacrylic acid copolymer) (the term "OPI" indicates an unexamined published patent application open to public inspection), Japanese Patent Publication No. 12577/83 (wherein the binder is, for example, an acrylonitrile/2-ethylhexyl methacrylate/methacrylic acid terpolymer), and Japanese Patent Publication No. 6210/80 (corresponding to U.S. Pat. No. 4,353,978) (wherein the binder is, for example, a methyl methacrylate/ethyl acrylate/acrylic acid terpolymer and a styrene partially esterified by isopropanol/maleic anhydride copolymer).

However, the compositions described in these references described above may have some advantages but show certain disadvantages in the case of use as, in particular, a photoresist. A so-called dry film resist method including a step of laminating a solid photosensitive film on a substrate under pressure at the case of making a printed wiring plate using a substrate laminated with a metal foil such as, usually a copper foil is described in Japanese Patent Publication No. 25231/70 (corresponding to U.S. Pat. No. 3,469,982). The photopolymerizable composition suitable for the method is required to have a proper balance in, for example, developability, strippability (the resistance to an etching solution or plating solution in the polymerized state), low stickiness, high adhesive property for the substrate, and flexibility.

On the other hand, conventional photopolymerizable compositions which can be developed by an alkaline aqueous solution have one or more faults in that they are too sticky or brittle, they have insufficient adhesive property to substrate and insufficient swelling resistance for providing images having a high resolving power, and/or they need an excessively long developing time although they can be developed by an alkaline aqueous solution.

Also, recently, it has been desired to increase the density of printed circuits, and for that purpose, a dry film resist capable of providing a resist image which is faithful to an original and has a high resolving power is required.

However, conventional photopolymerizable compositions which can be developed by an alkaline aqueous solution are insufficient for this purpose. This is mainly based on that the photoresist layers are lacking in swelling resistance to a developer and in adhesion to the substrate.

SUMMARY OF THE INVENTION

An object of this invention is to overcome the foregoing disadvantages of conventional photopolymerizable compositions capable of being developed by an aqueous alkali solution.

That is, the principal object of this invention is to provide a photopolymerizable composition which can be developed by a weak alkaline aqueous solution in a short period of time, has a sufficient flexibility as a dry film for being laminated on a substrate, has a high adhesive property for a substrate, shows less surface tackiness, does not have softness such that it undergoes cold flow during storage thereof, has excellent swelling resistance to a developer in portions that have been polymerized by an image exposure, and can be stripped off by processing with a weak alkaline aqueous solution containing no organic solvent.

A further object of this invention is to provide a photopolymerizable composition which can reproduce line images faithful to an original and having a high resolving power.

Thus, according to this invention, there is provided a photopolymerizable composition comprising an addition polymerizable unsaturated compound having at least two ethylenically unsaturated double bonds in the molecule, a photopolymerization initiator, and a binder, said binder being a copolymer having a weight average molecular weight of 5,000 to 5,000,000 and comprising at least one recurring unit of following group (A), at least one recurring unit of following group (B), and at least one recurring unit of following group (C), wherein (A) is a methacrylate or benzylmethacrylate unit each having a glass transition point of the homopolymer of higher than 50° C. and having an alkyl group having from 3 to 10 carbon atoms, (B) is an acrylate unit each having a glass transition point of the homopolymer of lower than 110° C. and having an alkyl group having from 1 to 6 carbon atoms, and (C) is an α,β-ethylenically unsaturated carboxylic acid unit, and wherein the content of the component of group (A) is from 5 to 70 mol%, the content of the component of group (B) is from 5 to 70 mol%, and the content of the component of group (C) is from 20 to 60 mol%, provided that the total content of the components of groups (A), (B) and (C) is 100 mol%.

DETAILED DESCRIPTION OF THE INVENTION

Then, specific examples of the preferred recurring units constituting the binders for use in this invention are shown below.

Specific examples of preferred component (A) are the units of (that is, derived from) isopropyl methacrylate, isobutyl methacrylate, sec-butyl methacrylate, tert-butyl methacrylate, cyclohexyl methacrylate, isobornyl methacrylate, and benzyl methacrylate. Among these units, a cyclohexyl methacrylate unit and a substituted or unsubstituted benzyl methacrylate unit are particularly preferred.

Specific examples of preferred component (B) are the units of (that is, derived from) methyl acrylate, ethyl acrylate, n-propyl acrylate, isopropyl acrylate, n-butyl acrylate, cyclohexyl acrylate, and sec-butyl acrylate. Among these units, a methyl acrylate unit, an ethyl acrylate unit, an n-propyl acrylate unit, and an n-hexyl acrylate unit are particularly preferred.

Specific examples of preferred component (C) are the units of (that is, derived from) acrylic acid, methacrylic acid, crotonic acid, itaconic acid, maleic acid or anhydride thereof, maleic acid monoalkyl ester, fumaric acid, fumaric acid monoalkyl ester, and p-vinyl-benzoic acid. Among these units, an acrylic acid unit and a methacrylic acid unit are particularly preferred.

Specific examples of the preferred polymers useful as the binders in this invention are set forth in Table 1, but the binders useful in this invention are not limited thereto. These polymers can be produced by known polymerization techniques.

About each of these groups (A), (B) and (C) constituting polymers, there is a preferred range of content for meeting the necessary properties as a binder. Component (C) imparts a developability with a weak alkaline aqueous solution, and the content thereof is preferably from 20 to 60 mol%. If the content is lower than 20 mol%, the development with a weak alkaline aqueous solution is more difficult, while if the content is higher than 60 mol%, the resistance of the resist image hardened by the photopolymerization to weak alkaline aqueous solution tends to be insufficient, whereby the resist image is liable to have defects. On the other hand, component (A) imparts a resistance to chemicals such as an alkaline developer, an etching solution, a plating solution, etc., to the resist and the preferred content range is from 5 to 70 mol%. If the content is lower than 5 mol%, the resistance to chemicals tends to be insufficient, while if the content is higher than 70 mol%, the developability tends to be insufficient since the resistance to alkali is too high. Component (B) imparts softness to the photosensitive layer, and the content is preferably from 5 to 70 mol%. If the content is lower than 5 mol%, the softness of the photosensitive layer tends to be deficient, while if the content is higher than 70 mol%, the layer tends to become too soft and hence is deficient in resistance to cold flow.

TABLE 1

| Polymer No. | Monomer Component (mol %) | | Polymerization Solvent (component ratio) | Weight Average Molecular Weight |
|---|---|---|---|---|
| 1-1 | Cyclohexyl Methacrylate | (20) | Methyl Cellosolve/ | 60,000 |
|  | Methyl Acrylate | (40) | Methyl Ethyl |  |
|  | Methacrylic Acid | (30) | Ketone (1/1) |  |
|  | Acrylic Acid | (10) |  |  |
| 1-2 | Cyclohexyl Methacrylate | (20) | n-Propanol | 98,000 |
|  | Methyl Acrylate | (40) |  |  |
|  | Methacrylic Acid | (40) |  |  |
| 1-3 | Cyclohexyl Methacrylate | (30) | n-Propanol | 85,000 |
|  | Methyl Acrylate | (30) |  |  |
|  | Methacrylic Acid | (40) |  |  |
| 1-4 | Cyclohexyl Methacrylate | (20) | n-Propanol | 35,000 |
|  | Butyl Acrylate | (40) |  |  |
|  | Methacrylic Acid | (40) |  |  |
| 1-5 | Cyclohexyl Methacrylate | (20) | Methyl Cellosolve/ | 48,000 |
|  | Butyl Acrylate | (40) | Methyl Ethyl |  |
|  | Methacrylic Acid | (20) | Ketone (1/1) |  |
|  | Acrylic Acid | (20) |  |  |
| 1-6 | Tert-butyl Methacrylate | (20) | Methyl Cellosolve | 40,000 |
|  | Methyl Acrylate | (40) | Acetate/Methyl |  |
|  | Methacrylic Acid | (40) | Ethyl Ketone (2/3) |  |
| 1-7 | Benzyl Methacrylate | (15) | Methyl Cellosolve/ | 76,000 |
|  | Methyl Acrylate | (45) | Methyl Ethyl |  |
|  | Methacrylic Acid | (40) | Ketone (1/1) |  |
| 1-8 | Cyclohexyl Methacrylate | (5) | Methyl Cellosolve/ | 47,000 |
|  | Ethyl Acrylate | (55) | Methyl Ethyl |  |
|  | Methacrylic Acid | (40) | Ketone (1/1) |  |
| 1-9 | Sec-butyl Methacrylate | (20) | Methyl Cellosolve/ | 40,000 |
|  | Methyl Acrylate | (40) | Methyl Ethyl |  |
|  | Methacrylic Acid | (40) | Ketone (1/1) |  |
| 1-10 | Isobutyl Methacrylate | (20) | Methyl Cellosolve/ | 52,000 |
|  | Methyl Acrylate | (40) | Methyl Ethyl |  |
|  | Methacrylic Acid | (40) | Ketone (1/1) |  |
| 1-11 | Isobornyl Methacrylate | (10) | Methyl Cellosolve/ | 30,000 |
|  | Ethyl Acrylate | (65) | Methyl Ethyl |  |
|  | Methacrylic Acid | (25) | Ketone (1/1) |  |

TABLE 1-continued

| Polymer No. | Monomer Component (mol %) | | Polymerization Solvent (component ratio) | Weight Average Molecular Weight |
|---|---|---|---|---|
| 1-12 | Cyclohexyl Methacrylate | (10) | Methyl Cellosolve/ | 26,000 |
| | n-Propyl Acrylate | (45) | Methyl Ethyl | |
| | Methacrylic Acid | (45) | Ketone (1/1) | |
| 1-13 | Tert-butyl Methacrylate | (15) | Methyl Cellosolve/ | 63,000 |
| | Cyclohexyl Acrylate | (50) | Methyl Ethyl | |
| | Methacrylic Acid | (35) | Ketone (1/1) | |
| 1-14 | Benzyl Methacrylate | (40) | Methyl Cellosolve/ | 50,000 |
| | Ethyl Acrylate | (10) | Methyl Ethyl | |
| | Methacrylic Acid | (50) | Ketone (1/1) | |
| 1-15 | Cyclohexyl Methacrylate | (30) | Methyl Cellosolve/ | 43,000 |
| | Sec-butyl Acrylate | (30) | Methyl Ethyl | |
| | Methacrylic Acid | (40) | Ketone (1/1) | |

A particularly preferred polymer composed of components (A), (B) and (C) in this invention, a quaternary copolymer composed of a combination of each of components (A) and (B), and two components of component (C), is represented by formula (I)

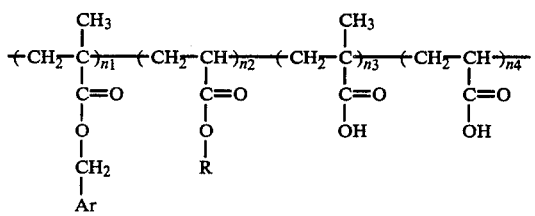

wherein Ar represents a phenyl group which may have a substituent; R represents an alkyl group having 1 to 6 carbon atoms; and $n_1$, $n_2$, $n_3$, and $n_4$ each represents mol% of each recurring unit, and $n_1$ is from about 30 to about 60, $n_2$ is from about 5 to about 30, $n_3$ is from about 10 to about 40, $n_4$ is from about 5 to about 40, and $n_3 + n_4$ is from about 20 to about 60.

Specific examples of Ar of formula (I) are a phenyl group, a p-methylphenyl group, an m-methylphenyl group, an o-methylphenyl group, a p-ethylphenyl group, an o-ethylphenyl group, a p-isopropylphenyl group, a p-methoxyphenyl group, a p-chlorophenyl group, an m-chlorophenyl group, an o-chlorophenyl group, a p-bromophenyl group, a 2,4-dimethylphenyl group, a 3,4-dimethylphenyl group, a 3,4-dimethoxyphenyl group. Among these groups, a phenyl group is particularly preferred.

Specific examples of R of formula (I) are a methyl group, an ethyl group, an n-propyl group, an isopropyl group, an n-butyl group, a sec-butyl group, an isobutyl group, a tert-butyl group, an n-pentyl group, an n-hexyk group, a cyclohexyl group, a cyclopentyl group, etc. Among these groups, a methyl group, an ethyl group, an n-propyl group, and an n-hexyl group are particularly preferred.

In formula (I), $n_1$ is preferably from about 30 mol% to about 60 mol%. If $n_1$ is lower than about 30 mol%, the resist is inferior in adhesion and if $n_1$ is higher than 60 mol%, the photosensitive layer is inferior in developability. It is particularly preferred that $n_1$ is from about 40 to about 55 mol%. Also, $n_2$ is preferably from about 5 mol% to about 30 mol%. If $n_2$ is lower than about 5 mol%, the resist is inferior in stripping property and if $n_2$ is higher than about 30 mol%, the resist is lacking in the resistance to an alkaline developer. It is particularly peferred that $n_2$ is from about 5 to about 20 mol%. Also, $n_3$ is preferably from about 10 mol% to about 40 mol%. If $n_3$ is lower than about 10 mol%, cold flow is liable to occur during the storages of the photosensitive layer and if $n_3$ is higher than about 40 mol%, the photosensitive layer is lacking in flexibility. It is particularly preferred that $n_3$ is from about 15 to about 35 mol%. Furthermore, $n_4$ is preferably about 5 mol% to about 40 mol%. If $n_4$ is lower than about 5 mol%, the resist is lacking in adhesion to a substrate and if $n_4$ is lower than about 40 mol%, cold flow is liable to occur. It is particularly preferred that $n_4$ be from about 7 mol% to about 30 mol%. Also, $n_3 + n_4$ is preferably from about 20 mol% to about 60 mol%. If the sum is lower than about 20 mol%, the developability is inferior and if the sum is higher than about 60 mol%, the resist is inferior in the resistance to alkaline developer.

The weight average molecular weight of the copolymer of formula (I) is generally from about 5,000 to about 5,000,000 and is preferably from about 10,000 to about 500,000 for a photosensitive dry film resist material. If the molecular weight is lower than about 10,000, a tent tends to be inferior in strength and if higher than about 500,000, the resist tends to be inferior in developability. It is particularly preferred that the average molecular weight is from about 20,000 to about 250,000.

Specific examples of the preferred copolymer shown by formula (I) are set forth in Table 2, but the copolymers for use in this invention are not limited thereto. These copolymers can be produced by known polymerization techniques.

TABLE 2

| Copolymer No. | Monomer Composition (mol %) | | Polymerization Solvent (component ratio) | Weight Average Molecular Weight |
|---|---|---|---|---|
| 2-1 | Benzyl Methacrylate | (50) | Methyl Cellosolve/ | 105,000 |
| | Methyl Acrylate | (10) | Methyl Ethyl Ketone | |
| | Methacrylic Acid | (20) | (1/1) | |
| | Acrylic Acid | (20) | | |
| 2-2 | Benzyl Methacrylate | (50) | Methyl Cellosolve/ | 44,000 |

TABLE 2-continued

| Copolymer No. | Monomer Composition (mol %) | | Polymerization Solvent (component ratio) | Weight Average Molecular Weight |
|---|---|---|---|---|
| | Methyl Acrylate | (10) | Methyl Ethyl Ketone/ | |
| | Methacrylic Acid | (20) | Isopropanol (1/1/1) | |
| | Acrylic Acid | (20) | | |
| 2-3 | Benzyl Methacrylate | (50) | Ethanol/Methyl Ethyl | 120,000 |
| | Ethyl Acrylate | (10) | Ketone (1/1) | |
| | Methacrylic Acid | (20) | | |
| | Acrylic Acid | (20) | | |
| 2-4 | Benzyl Methacrylate | (45) | n-Propanol | 85,000 |
| | n-Propyl Acrylate | (15) | | |
| | Methacrylic Acid | (30) | | |
| | Acrylic Acid | (10) | | |
| 2-5 | Benzyl Methacrylate | (40) | Methyl Ethyl Ketone/ | 40,000 |
| | n-Butyl Acrylate | (10) | Isopropanol (1/1) | |
| | Methacrylic Acid | (30) | | |
| | Acrylic Acid | (20) | | |
| 2-6 | Benzyl Methacrylate | (50) | Methyl Cellosolve/ | 75,000 |
| | n-Hexyl Acrylate | (5) | Methyl Ethyl Ketone | |
| | Methacrylic Acid | (35) | (1/1) | |
| | Acrylic Acid | (10) | | |
| 2-7 | Benzyl Methacrylate | (45) | Methyl Cellosolve/ | 41,000 |
| | Isopropyl Acrylate | (15) | Methyl Ethyl Ketone | |
| | Methacrylic Acid | (30) | (1/1) | |
| | Acrylic Acid | (10) | | |
| 2-8 | Benzyl Methacrylate | (50) | Methyl Cellosolve/ | 73,000 |
| | Cyclohexyl Acrylate | (5) | Methyl Ethyl Ketone | |
| | Methacrylic Acid | (35) | (1/1) | |
| | Acrylic Acid | (10) | | |
| 2-9 | Benzyl Methacrylate | (45) | Methyl Cellosolve/ | 96,000 |
| | Methyl Acrylate | (10) | Methyl Ethyl Ketone | |
| | Methacrylic Acid | (25) | (1/1) | |
| | Acrylic Acid | (20) | | |
| 2-10 | Benzyl Methacrylate | (40) | Methyl Cellosolve/ | 180,000 |
| | Methyl Acrylate | (10) | Methyl Ethyl Ketone | |
| | Methacrylic Acid | (30) | (1/1) | |
| | Acrylic Acid | (20) | | |

The polymerizable unsaturated compound which is suitably used for the photopolymerizable composition of this invention has at least two ethylenically unsaturated double bonds in the molecule and is capable of an addition polymerization.

The addition polymerizable unsaturated compounds for use in this invention may be used singly or as a mixture of two or more kinds. Preferred examples are the acrylic acid or methacrylic acid esters of polyols described, for example, in Japanese Patent Publication Nos. 5093/60, 14719/60 and 28727/69 (corresponding to British Pat. No. 1,154,872. For example, there are diethylene glycol di(meth)acrylate, triethylene glycol di(meth)acrylate, tetraethylene glycol di(meth)acrylate, nonaethylene glocyl di(meth)acrylate, pentaerythritol tri(meth)acrylate, trimethylolpropane tri(meth)acrylate, trimethylopropane di(meth)acrylate, pentaerythritol tetra(meth)acrylate, dipentaerythritol penta(meth)acrylate, dipentaerythritol hexa(meth)acrylate, 1,6-hexanediol di(meth)acrylate, etc., and bis(meth)acrylamides such as methylenebis(meth)acrylamide, ethylenebis(meth)acrylamide, m-xylylenebis(meth)acrylamide, etc. Furthermore, there are compounds having a urethane group, such as di(2-methacryloxyethyl)-2,4-tolylenediurethane, di(2-acryloxyethyl)hexamethylenediurethane, etc., and a (meth)acrylurethane oligomer obtained by reacting β-hydroxyalkyl (meth)acrylate and a terminal isocyanate compound obtained by the reaction of a polyol and diisocyanate, such as an oligomer obtained by reacting 1 mol of β-hydroxyethyl acrylate and a reaction product of 4 mols of 2,4-tolylene diisocyanate and 3 mols of ethylene glycol.

The content of the polymerizable unsaturated compound is preferably from about 7.5 to about 55% by weight, and more preferably from about 15 to about 45% by weight, based on the total weight of the photopolymerizable composition.

As the photopolymerization initiator for use in this invention, any compounds capable of initiating the polymerization of the foregoing polymerizable unsaturated compound can be used solely or as a combination of two or more kinds. The photopolymerization initiator or the photopolymerization initiating composition preferably contains at least one kind of component having a molecular extinction coefficient of at least 50 in the range of from about 3,000 to 8,000 Å, and preferably in the range of from 3,300 to 5,000 Å.

Specific examples of the preferred photopolymerization initiator are aromatic ketones such as benzophenone, 4,4'-bis(dimethylamine)benzophenone, 4,4'-bis(diethylamino)benzophenone, 4-methoxy-4'-dimethylaminobenzophenone, 4,4'-dimethoxybenzophenone, 4-dimethylaminobenzophenone, 4-dimethylaminoacetophenone, benzyl anthraquinone, 2-tert-butylanthraquinone, 2-methylanthraquinone, phenanthraquinone, xanthone, thioxanthone, 2-chlorothioxanthone, 2,4-diethylthioxanthone, fluorenone, acrydone, benzoin, etc.; benzoin ethers such as benzoin methyl ether, benzoin ethyl ether, benzoin propyl ether, benzoin isopropyl ether, benzoin phenyl ether, etc.; 2,4,5-triarylimidazole dimers, such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)4,5-diphenylimidazole dimer, 2-(p-methoxyphenyl)-4,5-diphenylimidazole dimer, etc.; polyhalide compounds such as carbon tetrabromide, phenyl tribromomethylsulfone, phenyltrichloromethyl ketone, and the compounds described in Japanese Patent Application (OPI) No. 133428/78, Japanese Patent Publication Nos. 1819/82 and 6096/82, U.S. Pat. No. 3,615,455. Examples of the combination of two or more kinds of the photopolymerization initiators are a combination of 2,4,5-triarylimidazole dimer and 2-mercaptobenzoxazole or Leuco Crystal Violet, etc.; the combination of 4,4'-bis(dimethylamino)benzophenone and benzophenone or benzoin methyl ether described in U.S. Pat. No. 3,427,161; the combination of benzoyl-N-methylnaphthothiazoline and 2,4-bis(trichloromethyl)-6-(p-methoxylphenyl)-2-triazine described in U.S. Pat. No. 4,239,850; and the combination of dimethylthioxanthone and 4-dialkylaminobenzoic acid ester described in Japanese Patent Application (OPI) No. 23602/82.

The content of the photocopolymerization initiator or the photopolymerization initiator system is from about 0.1 to about 10% by weight, and preferably from about 0.2 to about 6% by weight, based on the total weight of the photopolymerizable composition.

The photopolymerizable composition of this invention contains the photopolymerization initiator, the ethylenically unsaturated compound and the binder as the necessary components and may further contain a thermal polymerization preventing agent, a plasticizer, a dye, a discoloring agent, a monofunctional ethylenically unsaturated compound, an adhesion promotor for the surface of substrate, and other additives, whereby the properties of the photoresist, such as the photographic properties, the printing-out property, the filming property (film strength), etc., can be controlled.

The thermal polymerization preventing agent is added to prevent the occurrence of thermal polymerization or polymerization with the passage of time of the photoplymerizable composition of this invention and there are, for example, p-methoxyphenol, hydroquinone, t-butylcatechol, pyrogallol, 2-hydroxybenzophenone, 4-methoxy-2-hydroxybenzophenone, cuprous chloride, phenathiazine, chloranil, naphthylamine, β-naphthol, 2,6-di-t-butyl-p-cresol, nitrobenzene, dinitrobenzene, picric acid, p-toluidine, etc.

The pasticizer is added for controlling the properties of the film of the photopolymerizable composition. Examples of the plasticizer are phthalic acid esters such as dibutyl phthalate, diheptyl phthalate, dioctyl phthalate, diallyl phthalate, etc.; glycol esters such as triethylene glycol diacetate, tetraethylene glycol diacetate, etc.; phosphoric acid esters such as tricresyl phosphate, triphenyl phosphate, etc.; amides such as p-toluenesulfonamide, benzenesulfonamide, N-n-butylacetamide, etc.; aliphatic dibasic acid esters such as diisobutyl adipate, dioctyl adipate, dimethyl sebacate, dioctyl azelate, dibutyl malate, etc.; triethyl citrate, tributyl citrate, glycerol triacetyl ester, butyl aurate, dioctyl 4,5-diepoxycyclohexane-1,2-dicarboxylate, etc.

Examples of the dye are Brilliant Green, Eosine, Ethyl Violet, Erythrosine B, Methyl Green, Crystal Violet, Basic Fuchsine, phenolphthalein, 1,3-diphenyltriazine, Alizarin Red S, Thymolphthalein, Methyl Violet 2B, Quinanldine Red, Rose Bengale, Metanil Yellow, Thymolsulfonphthalein, Xylenol Blue, Methyl Orange, Orange IV, Diphenyl Thiocarbazone, 2,7-dichlorofluorescein, Para Methyl Red, Congo Red, Benzoprupurin 4B, α-Naphthyl Red, Nile Blue A, Phenacetolin, Methyl Violet, Malachite Green, Parafuchsine, Oil Blue #603 (made by Orient Kagaku K.K.), Victoria Blue BOH, Spiron Blue GN (made by Hodogaya Chemical Co., Ltd.), Rhodamine B, Rhodamine 6G, etc.

The discoloring agent is added to the photopolymerizable composition so that the composition can provide a visible image by light exposure. Specific examples of the discoloring agent are the foregoing dyes and diphenylamine, dibenzylaniline, triphenylamine, diethylaniline, diphenyl-p-phenylenediamine, p-toluidine, 4,4'-biphenyldiamine, o-chloroaniline, p,p',p"-hexamethyltriaminotriphenylmethane, p,p'-tetramethyldiaminotriphenylmethane, p,p',p"-triaminotriphenylcarbonol, leucomethyl violet, etc.

Specific examples of the adhesion promotor are benzimidazole, benzothiazole, benzoxazole, benztriazole, etc., as described in Japanese Patent Publication No. 9177/75 (corresponding to U.S. Pat. No. 3,662,334) and 2-mercaptobenzothiazole, 2-mercaptobenzimidazole, etc., as described in Japanese Patent Application (OPI) No. 702/78.

The photopolymerizable composition of this invention is used by dissolving the above-described various components for the composition in a solvent and coating the solution on a desired support in a known manner. As the solvent for use in this case, ethylene dichloride, monochlorobenzene, cyclohexanone, methyl ethyl ketone, acetone, methyl cellosolve acetate, ethyl acetate, methyl acetate, methyl cellosolve, toluene, xylene, etc., may be used solely or as a mixture thereof.

The photopolymerizable composition of this invention is suitable for a photoresist layer of a dry film resist. In this case, the thickness of the photoresist layer is preferably from 0.1 μm to 500 μm, and more preferably from 1 μm to 200 μm. Also, in the case of producing a photosensitive lithographic printing plate precursor using the photopolymerizable composition of this invention, the coating amount is generally 0.1 to 10.0 g/m$^2$, in particular 0.5 to 5.0 g/m$^2$ at dry coverage.

In the case of using the photopolymerizable composition of this invention as a dry film resist, films of polyamide, polyolefin, polyester, a vinyl polymer, cellulose ester, etc., having a thickness of from 3 μm to 100 μm can be suitably used as the support. A particularly suitable support film is a transparent polyethylene terephthalate film having a thickness of about 25 μm. Also, as a suitable protective film in this case, polyolefin is used, and a polyethylene film having a thickness of from 20 to 25 μm is particularly preferred.

Also, in the case of using the photopolymerizable composition of this invention for producing a photomask film, a polyethylene terephthalate film having a vapor-deposited layer of aluminum, aluminum alloy, or chromium and a polyethylene terephthalate film having a colored layer are suitably used as the support.

As a suitable support in the case of using the photopolymerizable composition of this invention as a photosensitive layer of a photosensitive lithographic printing plate, there are aluminum plates subjected to a hydrophilic property imparting treatment, such as a silicate-treated aluminum plate, an anodically oxidized aluminum plate, a sand-grained aluminum plate, a silicate-electrodeposited aluminum plate, etc. Furthermore, a zinc plate, a stainless steel plate, a chromium-treated steel plate, a plastic film of paper subjected to a hydrophilic property imparting treatment, etc., can be used as the support.

Also, in the case of using the photopolymerizable composition of this invention for the production of a color proof for printing, a film for an overhead projector, a film for a second original, etc., a transparent film such as a polyethylene terephthalate film, a cellulose triacetate film, etc., and the foregoing films the surface of which is chemically or physically matted can be suitably used as the support.

The photopolymerizable composition of this invention can be developed by a weak alkaline aqueous solution. the aqueous solution which is used for developing the photopolymerizable composition of this invention may contain a small amount (less than about 20% by weight) of an organic solvent which is miscible with water. The aqueous solution contains a base such as hydroxides, carbonates, hydrogencarbonates, silicates, phosphates, pyrophosphates, and acetates of an alkali metal, ammonium, or quaternary ammonium, and amines.

Specific examples of the base are lithium hydroxide, sodium hydroxide, potassium hydroxide, ammonium hydroxide, trimethylbenzylammonium hydroxide, sodium carbonate, potassium carbonate, sodium hydrogencarbonate potassium hydrogencarbonate, sodium silicate, sodium phosphate, potassium phosphate, sodium pyrophosphate, sodium acetate, diethanolamine, triethanolamine, etc. In particular, an aqueous solution of 1 to 2% sodium carbonate is preferred.

It is surprising that the photopolymerizable composition of this invention containing binder is excellent in flexibility at film formation and in adhesion for the substrate, has the excellent strippability of resist image, and gives a reproducibility faithful for an original image with a high resolving power. Thus, a substrate can be worked with high precision.

Furthermore, the photopolymerizable composition of this invention is excellent in cold flow resistance, and gives a photoresist surface having a low surface tackiness. Also, since the photopolymerizable composition has excellent adhesion for a substrate, the composition has a sufficient resist property to an etching solution such as an aqueous ferric chloride solution, an aqeous ammonium persulfate solution, etc., and during ordinary plating processing such as solder plating, copper pyrophosphate plating, copper sulfate plating, etc.

The composition of this invention can be particularly preferably used for a photoresist, but can also be advantageously used for other purposes. For example, the composition of this invention can be used for the production of presensitized photosensitive lithographic printing plate precursors (PS plates).

The following examples are intended to illustrate the present invention, but not to limit it in any way.

EXAMPLES 1 TO 23

Photosensitive liquids having the following composition containing the binder shown in Table 1 or a comparison binder shown in Table 3 below were prepared. Each of the photosensitive liquids was coated on a polyethylene terephathalate film of 25 μm in thickness at a dry thickness of about 50 μm by means of a rod coater and dried for 2 minutes in an oven of 100° C.

| | |
|---|---|
| Solution of 33 wt % Binder (shown in Table 1 or 3) | 45 g |
| Ethyl Michler's Ketone (4,4'-bis (N,N—diethyl)benzophenone) | 0.04 g |
| Benzophenone | 0.45 g |
| Tribromomethylphenylsulfone | 0.37 g |
| Trimethylolpropane Triacrylate | 6.5 g |

-continued

| | |
|---|---|
| Trimethylolpropane Diacrylate | 3.3 g |
| Leuco Crystal Violet | 0.08 g |
| 1-Phenyl-3-morpholinomethyl-1,3,4-triazole-2-thione | 0.08 g |
| Victoria Pure Blue BOH (trade mark) | 0.01 g |
| n-Propanol | 10 g |

The photosensitive film thus prepared was laminated on a dry copper-laminated plate so that the coated layer was in contact with the copper surface using an A 24-type Laminator (made by Du Pont) at 120° C. Then, the photosensitive layer was exposed through a circuit pattern (high contrast transparent image having conductor device pattern (line width of 100 μm) as transparent portions with opaque background) using 2 kw superhigh pressure mercury lamp, Jet Light (made by Orc K.K.). Then, the polyethylene terephthalate film was stripped off and an aqueous solution of 1 weight% sodium carbonate was sprayed onto the photosensitive layer for 100 seconds at 40° C. and 1.5 kg/cm$^2$, whereby the unexposed portions were removed.

The state of the resist images thus formed and the sharpness of the image lines were observed, and further the width of the image line was measured.

Then, the same printing procedure as above was followed using a resolving power test chart in place of the circuit pattern, the unexposed portions were removed in the same manner as above, and the line width capable of being distinguished in the resist image was observed, and is indicated as the resolving power.

Also, the resist films were laminated on both sides of both side copper-laminted plate having 100 through holes of 2.5 mm in inside diameter. Then, a circular pattern having a land diameter of 3.0 mm was printed on the resists films on both sides of the plate at each through hole using a 3 kw superhigh pressure mercury lamp double face simultaneous exposure apparatus HMW-6-N type (made by Orc K.K.) and then the unexposed portions were removed in the same manner as above to form a tent. For evaluating the strength of the tent thus formed, the plate was passed through hot spray of 5 kg/cm$^2$ at 54° C. and the number of tents remaining without being broken was measured to provide the retentivity (%) of the tent.

The copper-laminated plate having the printed and developed resist pattern of the conductor device pattern was etched by spraying an aqueous solution of 35% ferric chloride (at 40° C. and 1.5 kg/cm$^2$). Etching was performed until the copper at the portions uncovered by the resist image was completely dissolved. The etched plate was washed with water and dried to provide the conductor device pattern of copper yet covered by the resist. The resist was stripped off from the surface of copper by spraying an aqueous 5% sodium hydroxide solution for 2 minutes at 40° C., whereby the stripping property was tested. The results thus obtained are shown in Table 4 below.

TABLE 3

Comparison Polymer

| Polymer No. | Copolymer Composition (mol %) | | Weight Average Molecular Weight |
|---|---|---|---|
| 1-16 | Methyl Methacrylic | (90) | 95,000 |
| | Methacrylic Acid | (10) | |
| 1-17 | Styrene | (50) | 110,000 |
| | Maleic Acid-n-Butyl Ester | (50) | |

TABLE 3-continued

Comparison Polymer

| Polymer No. | Copolymer Composition (mol %) | | Weight Average Molecular Weight |
|---|---|---|---|
| 1-18 | n-Hexyl Methacrylate | (53) | 150,000 |
|  | Methyl Methacrylate | (20) |  |
|  | Methacrylic Acid | (27) |  |
| 1-19 | Methyl Methacrylate | (37) | 50,000 |
|  | Ethyl Acrylate | (56) |  |
|  | Methacrylic Acid | (7) |  |
| 1-20 | Styrene | (50) | 100,000 |
|  | Maleic Anhydride | (30) |  |
|  | Maleic Acid Monoisopropyl Ester | (20) |  |
| 1-21 | Benzyl Methacrylate | (73) | 70,000 |
|  | Methacrylic Acid | (27) |  |
| 1-22 | Cyclohexyl Methacrylate | (40) | 120,000 |
|  | Methyl Acrylate | (50) |  |
|  | Methacrylic Acid | (10) |  |
| 1-23 | Cyclohexyl Methacrylate | (60) | 130,000 |
|  | Methacrylic Acid | (40) |  |
| 1-24 | Acrylonitrile | (31) | 95,000 |
|  | 2-Ethylhexyl Methacrylate | (6) |  |
|  | Methacrylic Acid | (63) |  |

TABLE 4

Performance Comparison

| Example No. | Polymer No. | Resist Image Quality | Unbroken Portion of Tents After Spraying (%) | Width of Image Line ($\mu$m) | Resolving Power ($\mu$m) | Stripping off Property |
|---|---|---|---|---|---|---|
| 1 | 1-1 | Good | 98 | +8 | 50 | Good |
| 2 | 1-2 | " | 92 | +2 | 50 | " |
| 3 | 1-3 | " | 94 | +3 | 50 | " |
| 4 | 1-4 | " | 96 | +4 | 50 | " |
| 5 | 1-5 | " | 99 | +1 | 50 | " |
| 6 | 1-6 | " | 93 | +3 | 60 | " |
| 7 | 1-7 | " | 91 | +3 | 50 | " |
| 8 | 1-8 | " | 90 | +5 | 50 | " |
| 9 | 1-9 | " | 90 | +7 | 30 | " |
| 10 | 1-10 | " | 96 | +6 | 50 | " |
| 11 | 1-11 | " | 95 | +2 | 50 | " |
| 12 | 1-12 | " | 92 | +4 | 50 | " |
| 13 | 1-13 | " | 91 | +3 | 50 | " |
| 14 | 1-14 | " | 94 | +2 | 50 | " |
| 15 | 1-15 | " | 99 | +5 | 50 | " |
| 16 | 1-16 | Poor development | — | — | — | — |
| 17 | 1-17 | Good | 95 | +60 | 75 | Bad |
| 18 | 1-18 | " | 80 | +35 | 75 | " |
| 19 | Mixture of 1-19 & 1-20 (1:1) | Defect occurred | 96 | +20 | 100 | Good |
| 20 | 1-21 | Fairly good | 98 | +15 | 75 | Bad |
| 21 | 1-22 | Poor development | — | — | — | — |
| 22 | 1-23 | Defect occurred | 30 | +20 | 75 | Good |
| 23 | 1-24 | Defect occurred | 75 | +20 | 100 | " |

Note:
Example Nos. 1 to 15 are examples of this invention.
Examples Nos. 16 to 23 are comparison examples.
*About Example Nos. 16 and 21, other tests than the resist image line quality test could not be performed due to poor development of the resist film.

As is clear from the results shown in Table 4, in the case of using the polymer of this invention, the quality of the resist image is good, excellent reproducibility of image line width is obtained, and a high resolving power is obtained. Also, the strength of the tent is high and the stripping off property of the resists film is good.

EXAMPLE 24

A photosensitive liquid having the following composition was prepared, coated on a polyethylene terephthalate layer of 25 $\mu$m in thickness at a dry thickness of about 50 $\mu$m by a rod coater, and dried in an oven of 100° C. for 2 minutes to form a photosensitive layer.

| | |
|---|---|
| 2,4-Dimethylthioxanthone | 0.3 g |
| Ethyl 4-N,N—Dimethylaminobenzoate | 0.3 g |
| Trimethylolpropane Diacrylate | 3.3 g |
| Trimethylolpropane Triacrylate | 6.5 g |
| Leucomethyl Violet | 0.08 g |
| Tribromomethylphenylsulfone | 0.4 g |
| 1-Phenyl-3-morpholinomethyl-1,3,4-triazole-2-thione | 0.08 g |
| Victoria Pure Blue BOH | 0.008 g |
| Methyl Cellosolve/Methyl Ethyl Ketone (1/1) Solution of 33 wt % Polymer (No. 1-1 of Table 1) | 45 g |
| Methyl Cellosolve | 10 g |

The dry film resist was laminated on a copper-laminated plate as in Example 1. Then, a step wedge having an optical density differences between steps of 0.15 was superposed on the plate and the photosensitive resist layer was exposed for 20 counts by Jet Light (made by Orc K.K.). After stripping off the polyethylene terephthalates film, an aqueous 1% sodium carbonate solution of 40° C. was sprayed onto the resist film for 100 seconds, whereby the unexposed portions were dissolved off. Then, the step number of the step wedge image thus obtained was observed, which showed that images up to 8th step were hardened.

Also, the resist image of the circuit pattern obtained using the composition of this invention had resolving power of 50 $\mu$m and showed reproduction of the line width faithful to the original. Also, the image could sufficiently endure an etching solution of ferric chloride, a copper sulfate plating solution, a copper pyrophosphate plating solution, and a solder plating solution.

EXAMPLES 25 TO 34

Photosensitive liquids having the following composition containing each of the copolymers 2-1 to 2-10 shown in Table 2. Each of the photosensitive liquids was coated on a polyethylene terephthalate film of 25 $\mu$m in thickness at a dry thickness of about 50 $\mu$m by a rod coater and dried in an oven of 100° C. for 5 minutes to form a photosensitive layer.

| | |
|---|---|
| Solution of 33 wt % Binder (shown in Table 2) | 45 g |
| 2,4-Dimethylthioxanthone | 0.3 g |
| Ethyl p-Dimethylaminobenzoate | 0.33 g |
| Tribromomethylphenylsulfone | 0.4 g |
| Trimethylolpropane Triacrylate | 3.0 g |
| Trimethylolpropane Diacrylate | 2.0 g |
| Tetraethylene Glycol Diacrylate | 2.0 g |
| Leucomethyl Violet | 0.08 g |
| 1-Phenyl-3-morpholinomethyl-1,3,4-triazole-2-thione | 0.09 g |
| Victoria Pure Blue BOH | 0.01 g |
| Methyl Cellosolve | 10 g |

Then, the foregoing film was superposed on a dry copper-laminted plate so that the coated layer was in contact with the copper surface and laminated at 120° C. using an A 24-type laminator (made by Du Pont). The photosensitive layer was exposed through a circuit pattern (high contrast transparent image having a conductor device pattern (line width of 100 $\mu$m) as transparent portions with opaque background) to 2 kw superhigh pressure mercury lamp; Jet Light (made by Orc K.K.). Then, the polyethylene terephthalate film was stripped off and an aqueous 10% sodium carbonate solution of 40° C. was sprayed onto the resist layer for 60 seconds at 1.5 kg/cm$^2$ to remove the unexposed portions of the resist layer. The forming state of the resist image thus formed and the sharpness of the image line were observed and further the width of the image line was measured.

Then, the same printing procedure as above was followed using a resolving power test chart in place of the circuit pattern, the unexposed portions were removed in the same manner as above, and the line width capable of being distinguished in the resist image was observed, which was employed as the resolving power.

Also, the resist films were laminated on both sides of a both side copper-laminated plate having 100 through holes of 2.5 mm in inside diameter. Then, a circular pattern having a land diameter of 3.0 mm was printed on the resist films on both sides of the plate at each through hole using a 3 kw superhigh pressure mercury lamp double face simultaneous exposure apparatus HMW-6-N type (made by Orc K.K.) and then the unexposed portions were removed in the same manenr as above to form a tent. For evaluating the strength of the tent thus formed, the plate was passed through hot spray of 5 kg/cm$^2$ at 54° C. and the number of tents remaining without being broken was measured to provide the retentivity (%) of the tent.

The copper-laminated plate having the printed and developed resists pattern of the conductor device pattern was etched by spraying an aqueous solution of 35% ferric chloride (at 40° C. and 1.5 kg/cm$^2$). Etching was performed until the copper at the portions uncovered by the resists image was completely dissolved. The etched plate was washed with water and dried to provide the conductor device pattern of copper still covered by the resist. The resist was sprippped off from the surface of copper by spraying an aqueous 4% sodium hydroxide solution for 2 minutes at 40° C., whereby the stripping property was tested. The results thus obtained are shown in Table 5.

TABLE 5

| Example No. | Copolymer No. | Resist Image Quality | Unbroken Portion of Tents After Spraying (%) | Width of Image Line ($\mu$m) | Resolving Power ($\mu$m) | Stripping off Property |
|---|---|---|---|---|---|---|
| 25 | 2-1 | Good | 98 | +10 | 50 | Good |
| 26 | 2-2 | " | 92 | +5 | 30 | " |
| 27 | 2-3 | " | 95 | +12 | 50 | " |
| 28 | 2-4 | " | 97 | +8 | 50 | " |
| 29 | 2-5 | " | 99 | +2 | 30 | " |
| 30 | 2-6 | " | 91 | +5 | 60 | " |
| 31 | 2-7 | " | 96 | +4 | 50 | " |
| 32 | 2-8 | " | 98 | +3 | 50 | " |
| 33 | 2-9 | " | 90 | +9 | 50 | " |
| 34 | 2-10 | " | 96 | +10 | 50 | " |

As is clear from the results of Table 5, in the case of using the polymer of this invention, the quality of the resist image is good, excellent reproducibility of image line width is obtained, and a high resolving power is obtained. Also, the strength of the tent formed is high and the stripping property of the resists layer is good.

EXAMPLE 35

A photosensitive liquid having the following composition was prepared, coated on a polyethylene terephthalate film of 25 $\mu$m in thickness at a dry thickness of about 50 $\mu$m by a rod coater, and dried in an oven of 100° C. for 5 minutes to form a photosensitive layer.

| | |
|---|---|
| 2,4-Dimethylthioxanthone | 0.3 g |
| Ethyl 4-N,N—Dimethylaminobenzoate | 0.3 g |
| Trimethylolpropane Diacrylate | 4.0 g |
| Trimethylolpropane Triacrylate | 2.4 g |
| 2,2-Bis(acryloyloxyethoxyethoxyphenyl)propane | 1.6 g |
| Leucomethyl Violet | 0.08 g |
| Tribromomethylphenylsulfone | 0.4 g |
| 1-Phenyl-3-morpholinomethyl-1,3,4-triazol-2-thione | 0.08 g |
| Victoria Pure Blue BOH | 0.008 g |
| Methyl Cellosolve/Methyl Ethyl Ketone (1/1) Solution of 33 wt % Polymer (No. 2-1 of Table 2) | 45 g |
| Methyl Cellosolve | 10 g |

The photosensitive dry film resist material was laminated on a copper-laminated plate in the same manner as in Example 25. Then, a step wedge having an optical density differences of 0.15 was superposed on the plate and the photosensitive resist layer was exposed for 20 counts by Jet Light (made by Orc K.K.). After stripping off the polyethylene terephthalate film, an aqueous 1% sodium carbonate solution of 40° C. was sprayed onto the resist film for 60 seconds, whereby the unexposed portions were dissolved off. Then, the step number of the step wedge image thus obtained was observed, which showed that the images up to the 8th step were hardened.

Also, the resist image of the circuit pattern obtained by using the composition of this invention had a resolving power of 50 μm and showed the reproduction of line width faithful to the original. Also, the resist image sufficiently endured an etching solution of ferric chloride, a copper sulfate plating solution, a copper pyrophosphate plating solution, and a solder plating solution.

Furthermore, for stripping off the resist image thus obtained, it was possible by spraying an aqueous 4% sodium hydroxide solution for 2 minutes at 40° C. and at 1.5 kg/cm².

While the invention has been described in detail and with reference to specific embodiments thereof, it will be apparent to one skilled in the art that various changes and modifications can be made therein without departing from the spirit and scope thereof.

What is claimed is:

1. A photopolymerizable composition characterized by being used as a photoresist in the form of a storable sheet or roll on a peelable film support consisting essentially of an addition polymerizable unsaturated compound having at least two ethylenically unsaturated double bonds in the molecule, a photopolymerization initiator, and a binder, said binder being a copolymer composed of at least one recurring unit of group (A), at least one recurring unit of group (B), and at least one recurring unit of group (C), and having a weight average molecule weight of 5,000 to 5,000,000, wherein
    (A) is an alkyl methacrylate, benzyl methacrylate or an alkyl substituted benzyl methacrylate unit having a glass transition point of the homopolymer of higher than 50° C. and said alkyl methacrylate or alkyl substituted benzyl methacrylate having an alkyl group having from 3 to 10 carbon atoms,
    (B) is an acrylate unit having a glass transition point of the homopolymer of lower than 110° C. and having a alkyl group having from 1 to 6 carbon atoms, and
    (C) is an α,β-ethylenically unsaturated carboxylic acid unit, and wherein
    the content of the component of group (A) is from 5 to 70 mol%, the content of the component of group (B) is from 5 to 70 mol%, and the counter of the component of group (C) is from 20 to 60 mol%, provided that the total content of the components of groups (A), (B) and (C) is 100 mol%.

2. A photopolymerizable composition as in claim 1, wherein the copolymer composed of the recurring units of groups (A), (B) and (C) is a quaternary copolymer represented by formula (I)

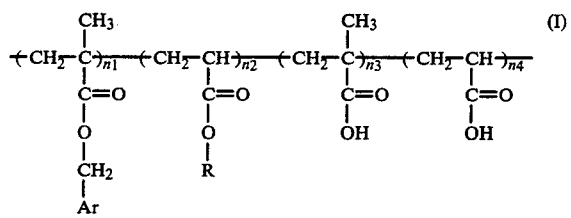

wherein Ar represents an unsubstituted or substituted phenyl group; R represents an alkyl group having from 1 to 6 carbon atoms; $n_1$, $n_2$, $n_3$ and $n_4$ each represents the mol% of each recurring unit; and $n_1$ is from about 30 to about 60, $n_2$ is from about 5 to about 30, $n_3$ is from about 10 to about 40, $n_4$ is from about 5 to about 40; and $n_3 + n_4$ is from 20 to about 60.

3. A photopolymerizable composition as in claim 2, wherein $n_1$ is from about 40 to about 55 mol%, $n_2$ is from about 5 to about 20 mol%, $n_3$ is from about 15 to about 35 mol%, and $n_4$ is from about 7 mol% to about 30 mol%.

4. A photopolymerizable composition as in claim 1, wherein the weight average molecular weight of the copolymer is from about 10,000 to about 500,000.

5. A photopolymerizable composition as in claim 2, wherein the weight average molecular weight of the copolymer is from about 10,000 to about 500,000.

6. A photopolymerizable composition as in claim 3, wherein the weight average molecular weight of the copolymer is from about 10,000 to about 500,000.

7. A photopolymerizable composition as in claim 1, wherein the weight average molecular weight of the copolymer is from about 20,000 to about 250,000.

8. A photopolymerizable composition as in claim 2, wherein the weight average molecular weight of the copolymer is from about 20,000 to about 250,000.

9. A photopolymerizable composition as in claim 3, wherein the weight average molecular weight of the copolymer is from about 20,000 to about 250,000.

10. A photopolymerizable composition as in claim 1, wherein
    the units of component (A) are selected from the group consisting of isopropyl methacrylate, isobutyl methacrylate, sec-butyl methacrylate, tert-butyl methacrylate, cyclohexyl methacrylate, isobornyl methacrylate, and benzyl methacrylate;
    the units of component (B) are selected from the group consisting of methyl acrylate, ethyl acrylate, n-propyl acrylate, isopropyl acrylate, n-butyl acrylate, cyclohexyl acrylate, and sec-butyl acrylate; and
    the units of component (C) are selected from the group consisting of acrylic acid, methacrylic acid, crotonic acid, itaconic acid, maleic acid or anhydride thereof, maleic acid monoalkyl ester, fumaric acid, fumaric acid monoalkyl ester, and p-vinylbenzoic acid.

11. A photopolymerizable composition as in claim 4, wherein
    the units of cmponent (A) are selected from the group consisting of isopropyl methacrylate, isobutyl methacrylate, sec-butyl methacrylate, tert-butyl methacrylate, cyclohexyl methacrylate, isobornyl methacrylate, and benzyl methacrylate;
    the unit of component (B) are selected from the group consisting of methyl acrylte, ethyl acrylate, n-propyl acrylate, isopropyl acrylate, n-butyl acrylate, cyclohexyl acrylate, and sec-butyl acrylate; and the units of component (C) are selected from the group consisting of acrylic acid, methacrylic acid, crotonic acid, itaconic acid, maleci acid or anhydride thereof, maleic acid monoalkyl ester, fumaric acid, fumaric acid monoalkyl ester, and p-vinylbenzoic acid.

12. A photopolymerizable composition as in claim 7, wherein the units of component (A) are selected from the group consisting of isopropyl methacrylate, isobutyl methacrylate, sec-butyl methacrylate, tert-butyl methacrylate, cyclohexyl methacrylate, isobornyl methacrylate, and benzyl methacrylate;

the units of component (B) are selected from the group consisting of methyl acrylate, ethyl acrylate, n-propyl acrylate, isopropyl acrylate, n-butyl acrylate, cyclohexyl acrylate, and sec-butyl acrylate; and the unit of component (C) are selected from the group consisting of acrylic acid, methacrylic acid, crotonic acid, itaconic acid, maleic acid or anhydride thereof, maleic acid monoalkyl ester, fumaric acid, fumaric acid monoalkyl ester, and p-vinylbenzoic acid.

13. A photopolymerizable composition as in claim 2, wherein Ar represents a phenyl group, a p-methylphenyl group, an m-methylphenyl group, an o-methylphenyl group, a p-ethylphenyl group, an o-ethylphenyl group, a p-isopropylphenyl group, a p-methoxyphenyl group, a p-chlorophenyl group, an m-chlorophenyl group, an o-chlorophenyl group, a p-bromophenyl group, a 2,4-dimethylphenyl group, a 3,4-dimethylphenyl group or a 3,4-dimethoxyphenyl group, and R represents a methyl group, an ethyl group, an n-propyl group, an isopropyl group, an n-butyl group, a sec-butyl group, an isobutyl group, a tert-butyl group, an n-pentyl group, an n-hexyl group, a cyclohexyl group or a cyclopentyl group.

* * * * *